US010886389B2

(12) United States Patent
Matsui

(10) Patent No.: US 10,886,389 B2
(45) Date of Patent: Jan. 5, 2021

(54) SEMICONDUCTOR DEVICE

(71) Applicant: FUJI ELECTRIC CO., LTD., Kanagawa (JP)

(72) Inventor: Toshiyuki Matsui, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 31 days.

(21) Appl. No.: 16/253,168

(22) Filed: Jan. 21, 2019

(65) Prior Publication Data

US 2019/0157437 A1     May 23, 2019

Related U.S. Application Data

(63) Continuation of application No. PCT/JP2017/046786, filed on Dec. 26, 2017.

(30) Foreign Application Priority Data

Feb. 24, 2017   (JP) .................. 2017-033815

(51) Int. Cl.
*H01L 29/00*      (2006.01)
*H01L 29/739*     (2006.01)
*H01L 29/10*      (2006.01)
*H01L 29/861*     (2006.01)
*H01L 27/06*      (2006.01)
(Continued)

(52) U.S. Cl.
CPC ...... *H01L 29/7397* (2013.01); *H01L 21/8234* (2013.01); *H01L 27/06* (2013.01); *H01L 27/0635* (2013.01); *H01L 29/06* (2013.01); *H01L 29/1095* (2013.01); *H01L 29/12* (2013.01); *H01L 29/739* (2013.01); *H01L 29/78* (2013.01); *H01L 29/861* (2013.01)

(58) Field of Classification Search
None
See application file for complete search history.

(56) References Cited

U.S. PATENT DOCUMENTS

2007/0120181 A1   5/2007   Ruething
2009/0242931 A1   10/2009  Tsuzuki
2015/0263144 A1   9/2015   Misu

FOREIGN PATENT DOCUMENTS

JP   2007134714 A   5/2007
JP   2009267394 A   11/2009
(Continued)

OTHER PUBLICATIONS

International Search Report for International Patent Application No. PCT/JP20171046786, issued by the Japan Patent Office dated Mar. 20, 2018.

*Primary Examiner* — Reema Patel

(57) ABSTRACT

There is provided a semiconductor device including a transistor portion and a diode portion. The transistor portion has a first-conductivity-type drift region formed inside a semiconductor substrate, a second-conductivity-type base region provided above the drift region inside the semiconductor substrate, and a second-conductivity-type collector region provided below the drift region inside the semiconductor substrate. The transistor portion has a second-conductivity-type well region provided inside the semiconductor substrate and extending downward beyond the base region and an injection amount restricting portion occupying at least a part of a region that is positioned below the well region and having a smaller second-conductivity-type carrier injection amount per unit area than the collector region.

9 Claims, 12 Drawing Sheets

(51) Int. Cl.
*H01L 29/78* (2006.01)
*H01L 29/12* (2006.01)
*H01L 21/8234* (2006.01)
*H01L 29/06* (2006.01)

(56) References Cited

FOREIGN PATENT DOCUMENTS

| | | |
|---|---|---|
| JP | 2012178583 A | 9/2012 |
| JP | 2012182470 A | 9/2012 |
| JP | 2015176927 A | 10/2015 |

SEMICONDUCTOR DEVICE

The contents of the following Japanese patent application(s) are incorporated herein by reference:
NO. 2017-033815 filed in JP on Feb. 24, 2017, and
NO. PCT/JP2017/046786 filed on Dec. 26, 2017.

BACKGROUND

Technical Field

The present invention relates to a semiconductor device.

A power IGBT (insulated gate bipolar transistor) having a plurality of cell arrays is known. In a cell array region having a lower cell density than other cell array regions, the injected holes are hard to be removed through the source electrode. Thereby, the hole current density increases, which may cause a latch-up. Accordingly, the following techniques are known to prevent the latch-up: in the cell array region of the low density, the P type doping concentration on the back surface portion of a substrate is made lower than in other cell array regions, and/or an N type dopants are implanted into the back surface portion of the substrate (see Patent Document 1, for example).

Patent document 1: Japanese Patent Application Publication No. 2012-182470

In a semiconductor device having a well region that extends deeper than a base region of a transistor portion, the breakdown voltage is low at the portion occupied by the deep well region. In particular, in a semiconductor device having a transistor portion and a diode portion such as a reverse conducting insulated gate bipolar transistor (RC-IGBT), a large difference in breakdown voltage is found between the portion occupied by the deep well region and the diode portion of high breakdown voltage. Accordingly, in order to increase the breakdown voltage of the entire semiconductor device, it is desirable that the breakdown voltage at the portion provided with the deep well region is increased.

SUMMARY

In a first aspect of the present invention, a semiconductor device including a transistor portion and a diode portion is provided. The transistor portion may have a first-conductivity-type drift region, a second-conductivity-type base region, and a second-conductivity-type collector region. The drift region may be formed inside a semiconductor substrate. The base region may be provided above the drift region inside the semiconductor substrate. The collector region may be provided below the drift region inside the semiconductor substrate. The semiconductor device may have a second-conductivity-type well region. The second-conductivity-type well region may extend downward beyond the base region inside the semiconductor substrate. The semiconductor device may have an injection amount restricting portion occupying at least a part of a region that is positioned below the well region. In the injection amount restricting portion, the second-conductivity-type carrier injection amount per unit area may be smaller than in the collector region.

The transistor portion may include an insulated gate bipolar transistor. The diode portion may include a freewheeling diode that is electrically connected to an insulated gate bipolar transistor.

The semiconductor device may have a signal pad region. The signal pad region may be in direct contact with the transistor portion or diode portion. The signal pad region may have an insulating film. The insulating film may be formed on the front surface of the semiconductor substrate. The signal pad region may have a conductive portion. The conductive portion may be formed on the insulating film. The well region may be provided below the conductive portion.

The injection amount restricting portion may include a first-conductivity-type conductive layer. The first-conductivity-type conductive layer may be provided below the well region at a same depth as the collector region.

The first-conductivity-type conductive layer may have a higher first-conductivity-type doping concentration than the drift region.

The injection amount restricting portion may include a second-conductivity-type conductive layer. The second-conductivity-type conductive layer may be provided below the well region. The second-conductivity-type conductive layer may have a lower second-conductivity-type doping concentration than the collector region.

The transistor portion may have a back surface electrode. The back surface electrode may be provided on the back surface of the semiconductor substrate and electrically connected to the collector region. The injection amount restricting portion may include an insulating film. The insulating film may be provided between the semiconductor substrate and the back surface electrode.

The well region may have a higher second-conductivity-type doping concentration than the base region.

The injection amount restricting portion may occupy the entire region that is positioned below the well region.

The injection amount restricting portion may be provided below a boundary point at which the transistor portion, the diode portion and the signal pad region abut one another.

Note that the summary of the above invention does not list all requisite features in the present invention. The present invention may also be a sub-combination of the features described above.

DESCRIPTION OF EXEMPLARY EMBODIMENTS

Hereinafter, embodiments of the present invention will be described. The embodiments do not limit the invention according to the claims, and all the combinations of the features described in the embodiments are not necessarily essential to means for solving in the invention.

In the present example, the X-axis and Y-axis are defined as the axes orthogonal to each other in a plane parallel to the upper surface of a semiconductor substrate. Also, the axis orthogonal to the X-axis and Y-axis is defined as the Z-axis. Note that in the present specification, the direction parallel to the Z-axis may be referred to as the depth direction of the semiconductor substrate.

Additionally, in the present specification, the terms "upper," "lower," "on," "under," "above," and "below" are not limited to mean the relative positions in the gravitational direction. These terms merely refer to relative directions with respect to a predetermined axis.

In the present specification and attached drawings, the letters "N" and "P" affixed to the layers and regions respectively mean that the electrons and holes are the major carriers in the layers and regions. In addition, the signs "+" and "−" affixed to the letters "N" and "P" respectively mean that the layers and regions have a higher doping concentration and a lower doping concentration respectively than the layers and regions without "+" and "−" appended.

Figure 1:
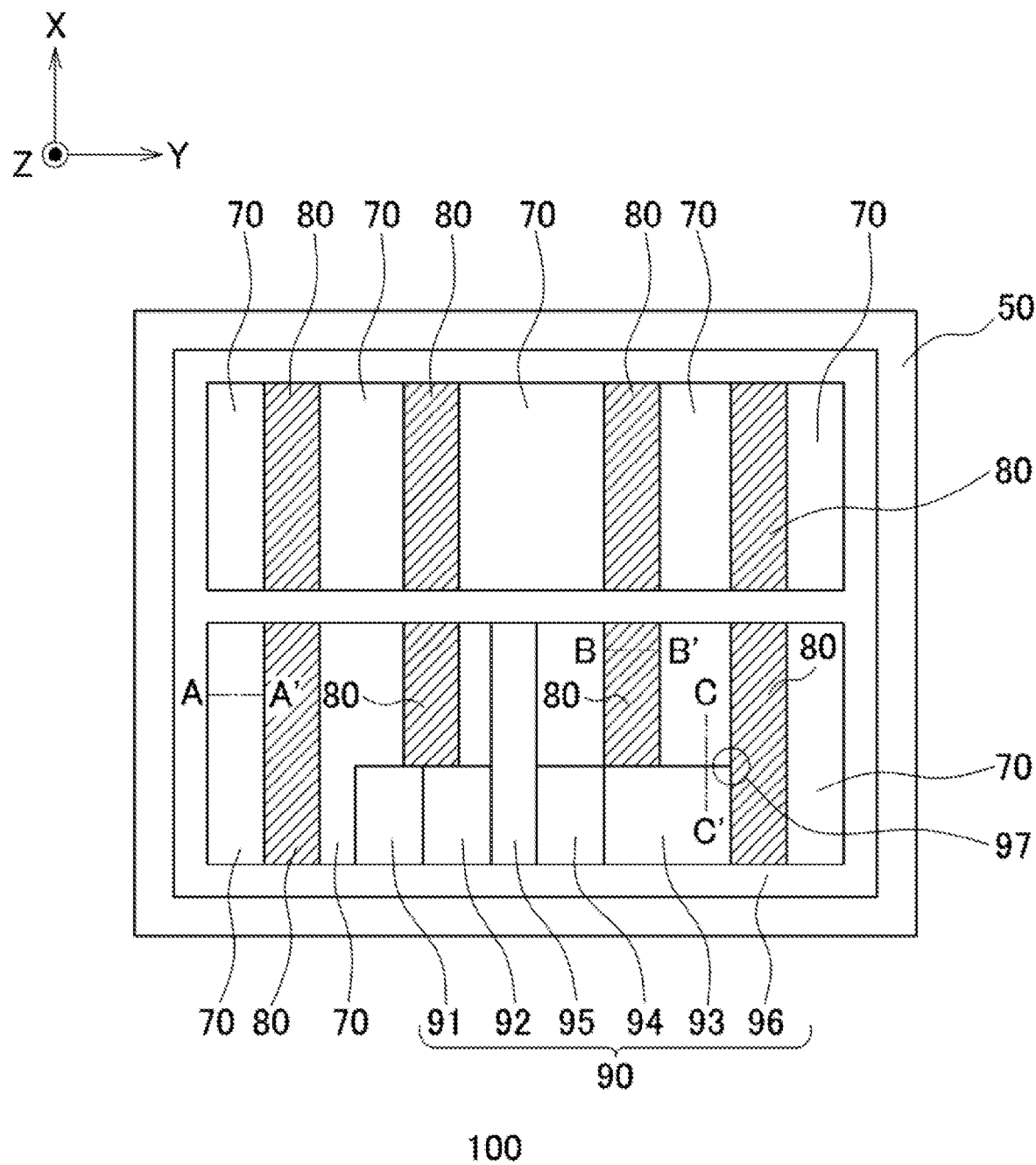
FIG. 1 is a view showing schematically a front surface of a semiconductor device 100 in accordance with an embodiment of the present invention.

FIG. 1 is a view showing schematically a front surface of a semiconductor device 100 in accordance with an embodiment of the present invention. The semiconductor device 100 in the present example is a semiconductor chip comprising a transistor portion 70 and a diode portion 80. The transistor portion 70 may include an insulated gate bipolar transistor. The diode portion 80 may include a freewheeling diode (FWD) that is electrically connected to an insulated gate bipolar transistor (IGBT).

The transistor portion 70 and the diode portion 80 may be periodically formed in a active region. The diode portion 80 is provided in direct contact with the transistor portion 70 in the front surface of the semiconductor substrate. The FWD is connected in reverse parallel to the IGBT. The semiconductor device 100 may comprise an edge termination structure 50 that surrounds the active region. The edge termination structure 50 has one or more of a guard ring, a field plate, a resurf and a combined structure of these. The semiconductor device 100 comprises a signal pad region 90 in direct contact with the transistor portion 70 or the diode portion 80. In the semiconductor device 100, there may exist a boundary point 97 at which the transistor portion 70, the diode portion 80 and the signal pad region 90 abut one another. FIG. 1 shows one example of the boundary point 97.

The signal pad region 90 comprises an insulating film formed on a front surface of the semiconductor substrate, the conductive portion formed on the insulating film, a well region of a second conductivity type provided below the conductive portion inside the semiconductor substrate. As one example, the semiconductor substrate may be a Si substrate, and is a compound semiconductor substrate of silicon carbide SiC, gallium nitride GaN or the like. As one example, the insulating film may be an oxide film such as silicon oxide film or a nitride film such as silicon nitride film. As one example, the conductive portion is formed of a metal material. As long as the signal pad region 90 is a region with the above insulating film, conductive portion and well region formed, it also includes a region in which a wiring other than the pad is formed as the conductive portion. As one example, the signal pad region 90 may include at least one of pad regions for sensor 91, 92 and 93, a gate pad region 94, a temperature sensor wiring region 95 and a gate runner portion region 96.

The pad regions for sensor 91, 92 are the regions in which a pad for temperature detection section is formed. The pad region for sensor 93 is the region in which a pad for current detection is formed. The gate pad region 94 is the region in which a gate pad that connects to a gate metal layer of the transistor portion 70 is formed. The temperature sensor wiring region 95 may be the region in which a temperature sensor itself is formed, and may be the region in which a wiring to be connected to the temperature sensor is formed. The gate runner portion region 96 is the region in which a gate wiring portion that connects to the gate metal layer of the transistor portion 70 is formed.

Figure 2:
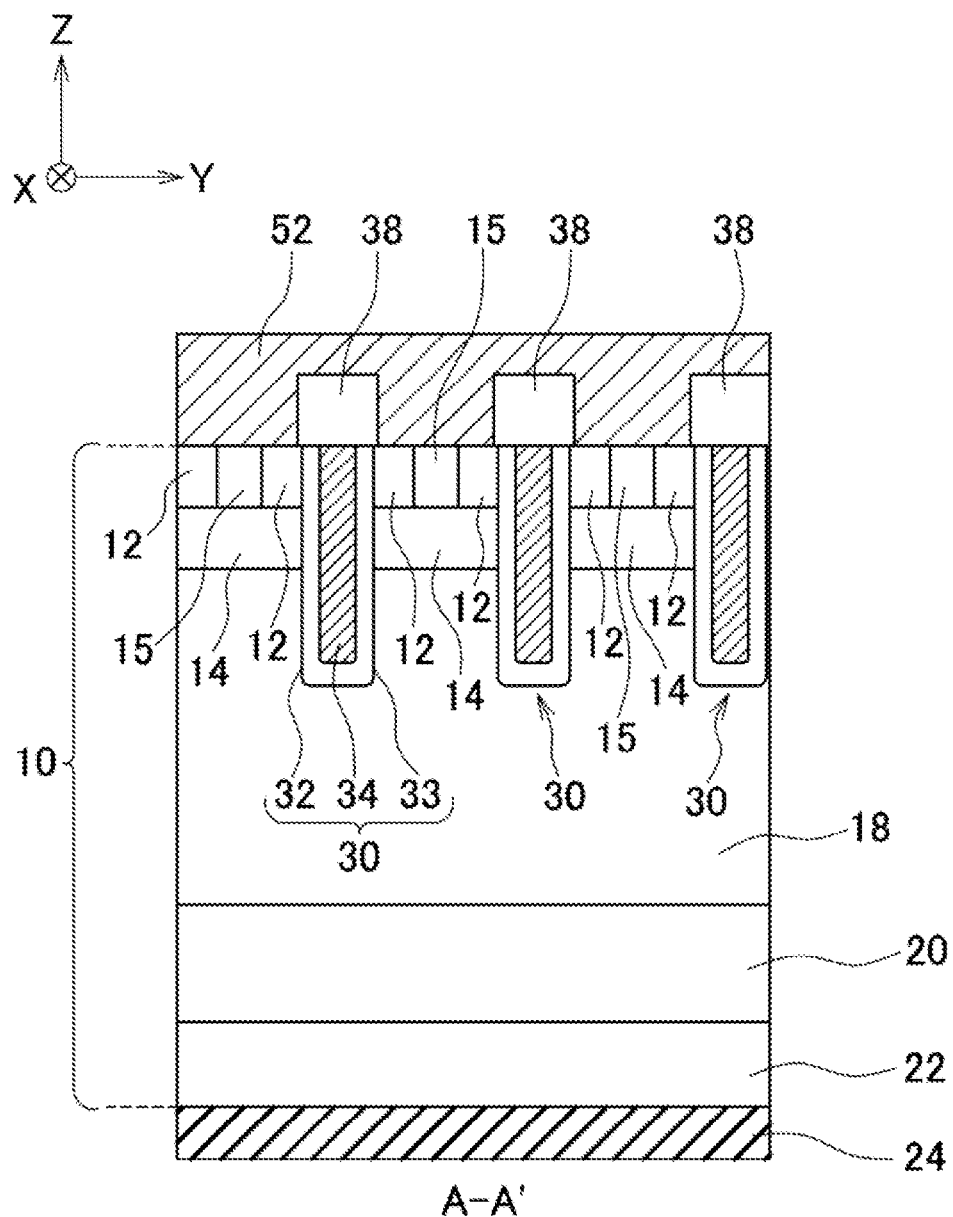
FIG. 2 is a view showing one example of an A-A' section in FIG. 1.

FIG. 2 is a view showing one example of the cross section A-A' in FIG. 1. FIG. 2 shows one example of a structure of the transistor portion 70. The transistor portion 70 comprises an emitter region 12, a base region 14, a contact region 15, a drift region 18, a buffer region 20, a collector region 22, a back surface electrode 24 and a trench gate 30. The transistor portion 70 is defined as a partial region of the active region that corresponding to the projected region obtained by projecting, onto the front surface, the collector region 22 perpendicularly to the back surface of the semiconductor substrate 10. In the transistor portion 70, predetermined unit structures each including the emitter region 12 and the contact region 15 are regularly arranged.

The drift region 18 is formed inside the semiconductor substrate 10. The drift region 18 is of N− type. In the present example, a first conductivity type is defined as N type, while a second conductivity type is defined as P type. However, in another example, the first conductivity type may be defined as P type, while the second conductivity type may be defined as N type. The collector region 22 is provided below the drift region 18 inside the semiconductor substrate 10. The collector region 22 is of P type. In the present example, an N type buffer region 20 is provided on the lower surface of the drift region 18. A doping concentration of the buffer region 20 may be higher than that of the drift region 18. The buffer region 20 may be acted as a field stop layer. The field stop layer prevents a depletion layer that will extend from the lower surface of the base region 14, from reaching the collector region 22. The collector region 22 may be provided at a lower surface of the buffer region 20.

The base region 14 may be provided above the drift region 18 inside the semiconductor substrate 10. The base region 14 is of P type. The emitter region 12 may be provided above the base region 14 inside the semiconductor substrate 10. The contact region 15 may be formed on the front surface of the base region 14. The contact region 15 may be a P+ type region having a higher doping concentration than the base region 14. The contact region 15 reduces a contact resistance between the base region 14 and the emitter electrode 52.

The trench gate 30 passes through the base region 14 from the front surface of the semiconductor substrate 10 to reach the drift region 18. In the transistor portion 70, the plurality of trench gates 30 are provided at predetermined intervals. The trench gate 30 has a gate trench 33, a gate insulating film 32, and a gate conductive portion 34 provided in the semiconductor substrate 10. The gate insulating film 32 is provided by covering the inner wall of the gate trench 33. The gate insulating film 32 may be formed by oxidizing or nitriding the semiconductor of the inner wall of the gate trench 33.

The gate conductive portion 34 is provided inside of the gate insulating film 32, inside the gate trench 33. That is, the gate insulating film 32 insulates the gate conductive portion 34 from the semiconductor substrate 10. The gate conductive portion 34 is formed of a conductive material such as polysilicon. The gate trench 33 is covered with an interlayer dielectric film 38 in the front surface of the semiconductor substrate 10. The emitter electrode 52 is located on the front surface of the semiconductor substrate 10 and on the interlayer dielectric film 38. The interlayer dielectric film 38 insulates electrically between the emitter electrode 52 and the trench gate 30. The emitter electrode 52 is formed of a conductive material such as metal.

The gate conductive portion 34 inside the trench gate 30 is electrically connected to the gate metal layer through the gate runner portion that is formed in the gate runner portion region 96. The back surface electrode 24 is provided on the back surface of the semiconductor substrate 10. The back surface electrode 24 may be in contact with the P+ type collector region 22. The back surface electrode 24 is electrically connected to the P+ type collector region 22 to act as a collector electrode. The back surface electrode 24 is formed of a conductive material such as metal.

Figure 3:
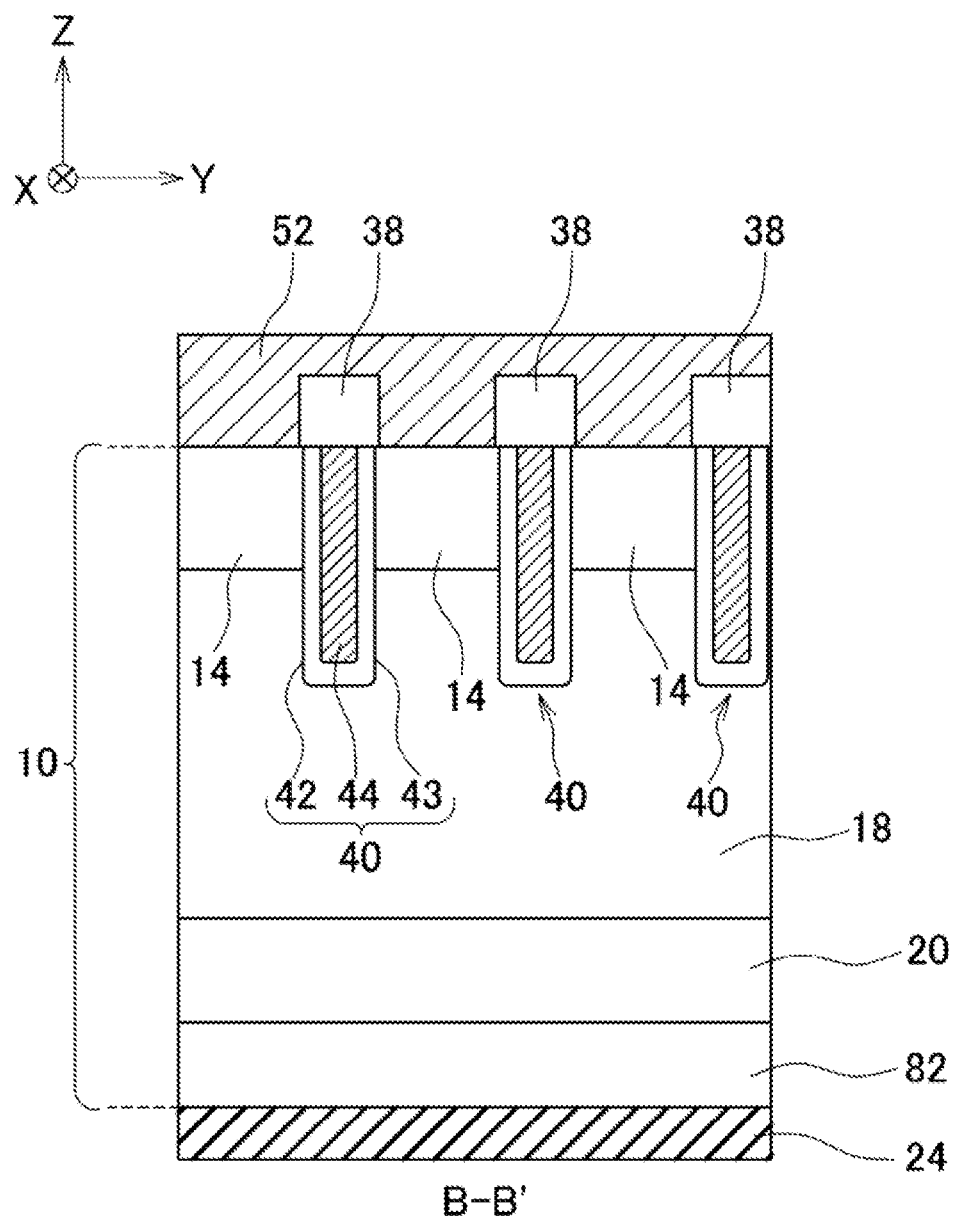
FIG. 3 is a view showing one example of a B-B' section in FIG. 1.

FIG. 3 is a view showing one example of a B-B' section in FIG. 1. FIG. 3 shows one example of a structure of the diode portion 80. The above-mentioned P type base region 14, drift region 18, buffer region 20, interlayer dielectric film 38 and emitter electrode 52 are provided from the transistor portion 70 to the diode portion 80. The diode portion 80 comprises a trench portion 40 and a cathode region 82. The N+ type emitter region 12 and the P+ type contact region 15 are not provided in the diode portion 80.

Note that as a definition of the diode portion 80, the definition refers to a projected region where in the active region, the cathode region 82 is projected on the back surface region or the front surface corresponding to the cathode region 82, perpendicularly to the back surface of the semiconductor substrate. The P type base region 14 is provided above the drift region 18 inside the semiconductor substrate 10. In the diode portion 80, the P type base region 14 also serves as the P type anode region of the FWD. In addition, part of the emitter electrode 52 also serves as the cathode region 82, and is in contact with the base region 14.

The trench portion 40 passes through the base region 14 (anode region) from the front surface of the semiconductor substrate 10 to reach the drift region 18. In the diode portion 80, the plurality of trench portions 40 are provided at predetermined intervals. The trench portion 40 has a trench 43, a trench insulating film 42, and a trench conductive portion 44 provided in the semiconductor substrate 10. The trench insulating film 42 is provided by covering the inner wall of the gate trench 43. The trench insulating film 42 may be formed by oxidizing or nitriding the semiconductor of the inner wall of the trench 43.

The trench conductive portion 44 is provided inside of the trench insulating film 42, inside the gate trench 43. The trench insulating film 42 insulates the trench conductive portion 44 from the semiconductor substrate 10. The trench conductive portion 44 is formed of a conductive material such as polysilicon. The trench conductive portion 44 inside the trench portion 40 is not connected to the gate runner. The trench conductive portion 44 is electrically connected to the emitter electrode 52 that acts as the anode electrode through a contact hole and so on. The diode portion 80 comprises the cathode region 82 below the drift region 18 inside the semiconductor substrate 10. The cathode region 82 is of N+ type. The cathode region 82 may be provided at the lower surface of the buffer region 20.

The semiconductor device 100 has a structure in which the transistor portion 70 and the diode portion 80 are periodically arranged as shown in FIG. 2 and FIG. 3. In the case where the pitch of the plurality of trench gates 30 and so on is wide in the transistor portion 70, the equipotential plane of the active region depends on the trench gates 30 and periodically varies, so that the electric field strength at the bottom of the trench gate 30 is increased. Accordingly, the breakdown voltage at the bottom portion of the trench gate 30 is lowered. Therefore, in many cases, the breakdown voltage of the entire semiconductor device 100 is also determined by the breakdown voltage inside the active region. If the pitch of the trench gates 30 is reduced, however, the equipotential plane does not greatly vary, so that the breakdown voltage in the active region is increased. Accordingly, the breakdown voltage in the signal pad region 90 may possibly determine the breakdown voltage of the entire semiconductor device 100. In light of the above, in the semiconductor device 100 of the present example, the breakdown voltage in the signal pad region 90 is improved to increase the breakdown voltage of the entire semiconductor device 100.

Figure 4:
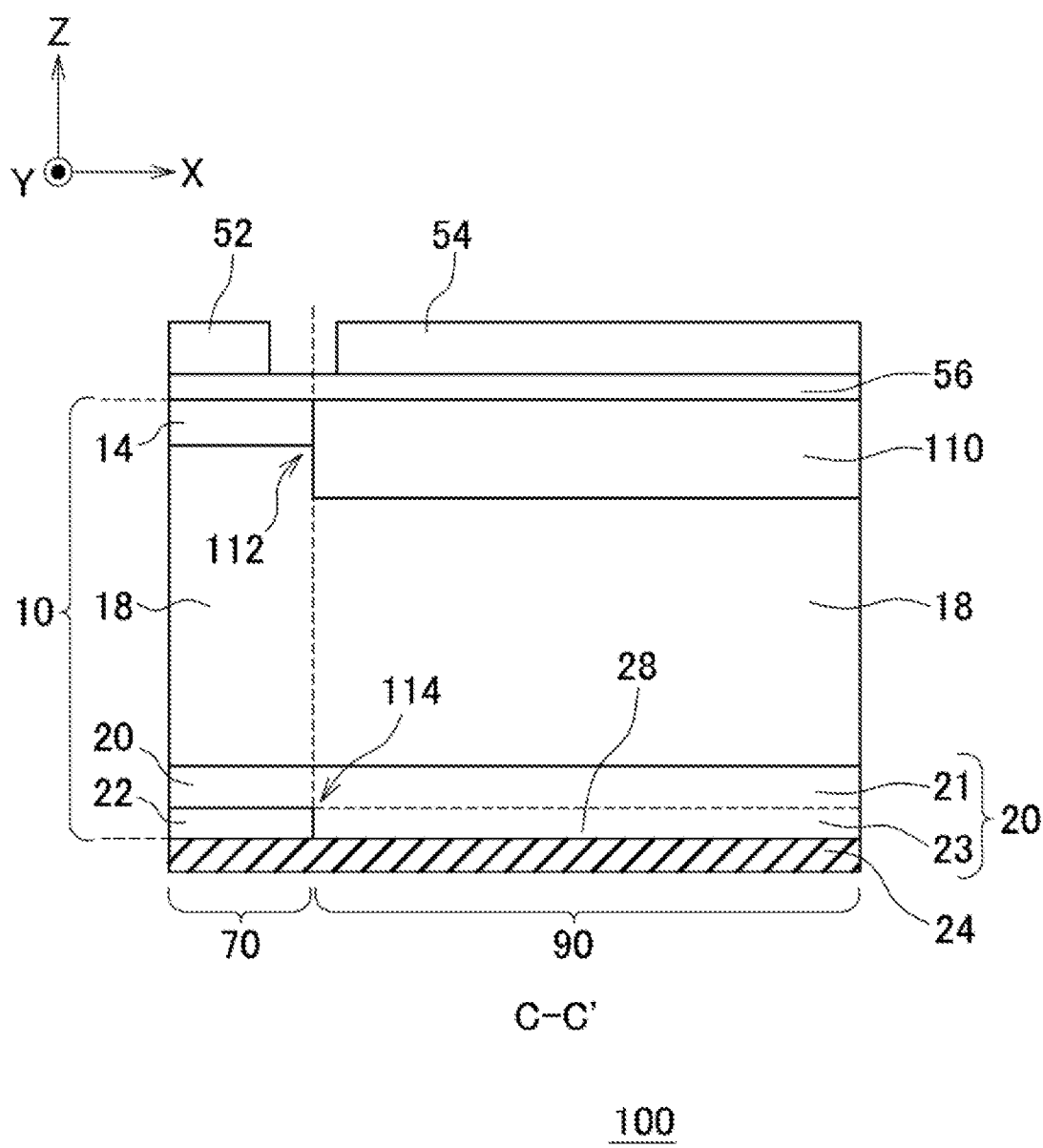
FIG. 4 is a view showing one example of a C-C' section in FIG. 1.

FIG. 4 is a view showing one example of a C-C' section in FIG. 1. FIG. 4 shows mainly a structure in the signal pad region 90. The signal pad region 90 has an insulating film 56, a conductive portion 54, and a P+ well region 110. The P+ well region 110 may be provided with an emitter potential when electrically connected to the emitter electrode 52. In addition, the signal pad region 90 may have the drift region 18 and the back surface electrode 24 described above. Accordingly, the drift region 18 and the back surface electrode 24 may extend in both the signal pad region 90 and the transistor portion 70.

The insulating film 56 is formed on the front surface of the semiconductor substrate 10. The insulating film 56 may be formed integrally with the gate insulating film 32 described in FIG. 2. In this case, the insulating film 56 may be the same material as that of the gate insulating film 32, and may have the same thickness as that of the gate insulating film 32. The insulating film 56 may be formed by oxidizing or nitriding the front surface of the semiconductor substrate 10. The conductive portion 54 is provided on the front surface of the semiconductor substrate 10 through the insulating film 56. The conductive portion 54 may be formed by a conductive material such as metal or polysilicon. In the present example, the conductive portion 54 is a metal film such as aluminum. The conductive portion 54 may be a pad layer, may be a wiring, and may be a sensor section.

The P+ well region 110 may be provided below the conductive portion 54 inside the semiconductor substrate 10. The P+ well region 110 may extend downwardly from the front surface of the semiconductor substrate 10. The P+ well region 110 extends downward beyond the base region 14 in the transistor portion 70. That is, the depth of the P+ well region 110 in the thickness direction of the semiconductor substrate 10 (Z-axis direction) may be greater than that of the base region 14 in the transistor portion 70. The P+ well region 110 may have a P+ type doping concentration higher than a P type doping concentration of the P type base region 14 in the transistor portion 70.

In the present example, the semiconductor device 100 has an injection amount restricting portion 28 that occupies at least a part of the region that is positioned below the P+ well region 110 and that has a smaller second-conductivity-type carrier injection amount per unit area than the collector region 22. The injection amount restricting portion 28 includes an N type conductive layer that is provided below the P+ well region 110 at the same depth as the collector region 22. Here, when two or more regions are provided at the same depth, this phrase means not only a case where their front and back surfaces are positioned at the same position in the thickness direction of the semiconductor substrate 10 (the Z-axis direction) but also case where the regions are positioned together at any position in the thickness direction of the semiconductor substrate 10 (the Z-axis direction).

In the present example, the buffer region 20 is provided as the N type conductive layer. The buffer region 20 in the signal pad region 90 may include a first buffer region 21 and a second buffer region 23. The first buffer region 21 is provided at the same depth as that of the buffer region 20 in the transistor portion 70. The second buffer region 23 is provided at the same depth as that of the collector region 22 to be in contact with the back surface electrode 24.

The N type conductive layer provided below the P+ well region 110 at the same depth as the collector region 22 may have a N type doping concentration higher than a N type doping concentration in the drift region 18. In the present example, a N type doping concentration of the second buffer region 23 may be higher than the N type doping concentration in the drift region 18. Thereby, a contact resistance between the N type conductive layer and the back surface electrode 24 can be lowered. Each of the N type doping concentrations of the first buffer region 21 and the second buffer region 23 may be higher than the N type doping concentration in the drift region 18.

The N type conductive layer provided at the same depth as that of the collector region 22 is not limited to the buffer region 20. When the semiconductor device 100 dose not have the buffer region 20, the drift region 18 may be an N type conductive layer provided at the same depth as that of the collector region 22.

In the present example, the injection amount restricting portion 28 occupies the entire region that is positioned below the P+ well region 110. In a view from above, the injection amount restricting portion 28 may be partitioned to include at least the P+ well region 110. In the view from above, a position of an end portion 114 of the injection amount restricting portion 28 may match with that of an end portion 112 of the P+ well region 110. The view from above means a case viewed from the front surface of the semiconductor substrate 10.

According to the present example, the P+ well region 110 is provided. A resistivity thereof can be reduced by the P+ well region 110. The reduction of the resistivity provides also a lower voltage drop (electromotive force) in current flowing. Accordingly, since the electromotive force is also lowered to be generated when a current flows from the transistor portion 70 in direct contact with the P+ well region 110 along a plane (XY plane) in parallel to the insulating film 56, the insulating film 56 of the signal pad region 90 can be prevented from being damaged.

Since the P+ well region 110 is formed deeper than the base region 14 in the transistor portion 70, a breakdown voltage at the signal pad region 90 to be provided with the P+ well region 110 is liable to be lowered. However, according to the semiconductor device 100 of the present example, there is no collector region 22 in an region that is positioned below the P+ well region 110. In other words, in at least a part of the region below the P+ well region 110, the semiconductor device 100 has the injection amount restricting portion 28 having a smaller second-conductivity-type carrier injection amount per unit area than the collector region 22.

If a smaller amount of carriers of the second conductivity type is injected into the region positioned below the P+ well region 110 from the back surface electrode 24, the breakdown voltage increases. The depletion layer is liable to extend inside the semiconductor substrate 10 to a portion free of the carriers. Accordingly, when the carriers of the second conductivity type are injected from the back surface electrode 24, the depletion layer is less likely to expand, so that the breakdown voltage becomes lower than when no carriers are injected. Conversely, if a local portion having no second-conductivity-type carriers injected thereinto from the back surface electrode 24 is created, the depletion layer can expand, so that the breakdown voltage in this portion rises.

According to the semiconductor device 100 of the present example, in a region that the breakdown voltage is liable to be lowered due to the presence of the P+ well region 110, the injection of the carriers of the second conductivity type is reduced. Accordingly, due to the presence of the P+ well region 110, the breakdown voltage in the region of which the breakdown voltage is liable to be lowered can be increased. Thereby, a difference in breakdown voltage inside the semiconductor device 100 is reduced, so that the breakdown voltage inside the semiconductor device 100 can be increased.

The injection amount restricting portion 28 may not necessarily overlap the entire signal pad region 90. The injection amount restricting portion 28 may be at least provided below the boundary point 97 at which the transistor portion 70, the diode portion 80 and the signal pad region 90 abut one another. In particular, when the semiconductor device 100 is a RC-IGBT, the breakdown voltage of the diode portion 80 having no carrier injection from the back surface electrode 24 side is higher, so that a difference in breakdown voltage is liable to be generated in the boundary point 97 as shown in FIG. 1. Since the injection amount restricting portion 28 is provided below the boundary point 97, the difference in breakdown voltage inside the semiconductor device 100 can be reduced.

One example of the manufacturing method of the semiconductor device 100 in the present example will be described. First, in the front surface of the semiconductor device 100, impurity regions such as the emitter region 12 and the base region 14 is formed. In addition, an impurity region such as the P+ well region 110 is also formed. The base region 14 may be formed by implantation of an impurity such as phosphorus. The P+ well region 110 may be formed by implantation of the impurity such as boron. In addition, the trench gate 30 and so on are formed after the impurity regions are formed. Then, the interlayer dielectric film 38 that covers each trench gate 30 is formed.

Then, the emitter electrode 52 is formed. The emitter electrode 52 may be formed by sputtering. In the sputtering, a temperature of the semiconductor substrate 10 may be set approximately between 350° C.° and 450° C.°. Then, the front surface and the opposite side of the semiconductor substrate 10 are grinded to adjust a thickness of the semiconductor substrate 10. The thickness of the semiconductor substrate 10 is set according to the breakdown voltage of the semiconductor device 100 to be involved.

Then, a back surface structure of the semiconductor device 100 will be formed. A back surface structure has, for example, the collector region 22 and the cathode region 82. The collector region 22 may be formed by implantation of the P type impurity such as boron. During formation of the collector region 22, a mask may be formed in a region corresponding to the region positioned below the P+ well region 110, that is, the signal pad region 90, so as to prevent the P type impurity such as boron from being implanted. As a result, the collector region 22 is not formed below the P+ well region 110. Then, a proton is injected from the back surface of the semiconductor substrate 10 to form the buffer region 20. The semiconductor substrate 10 is annealed to activate the proton injected in the buffer region 20.

Figure 5:
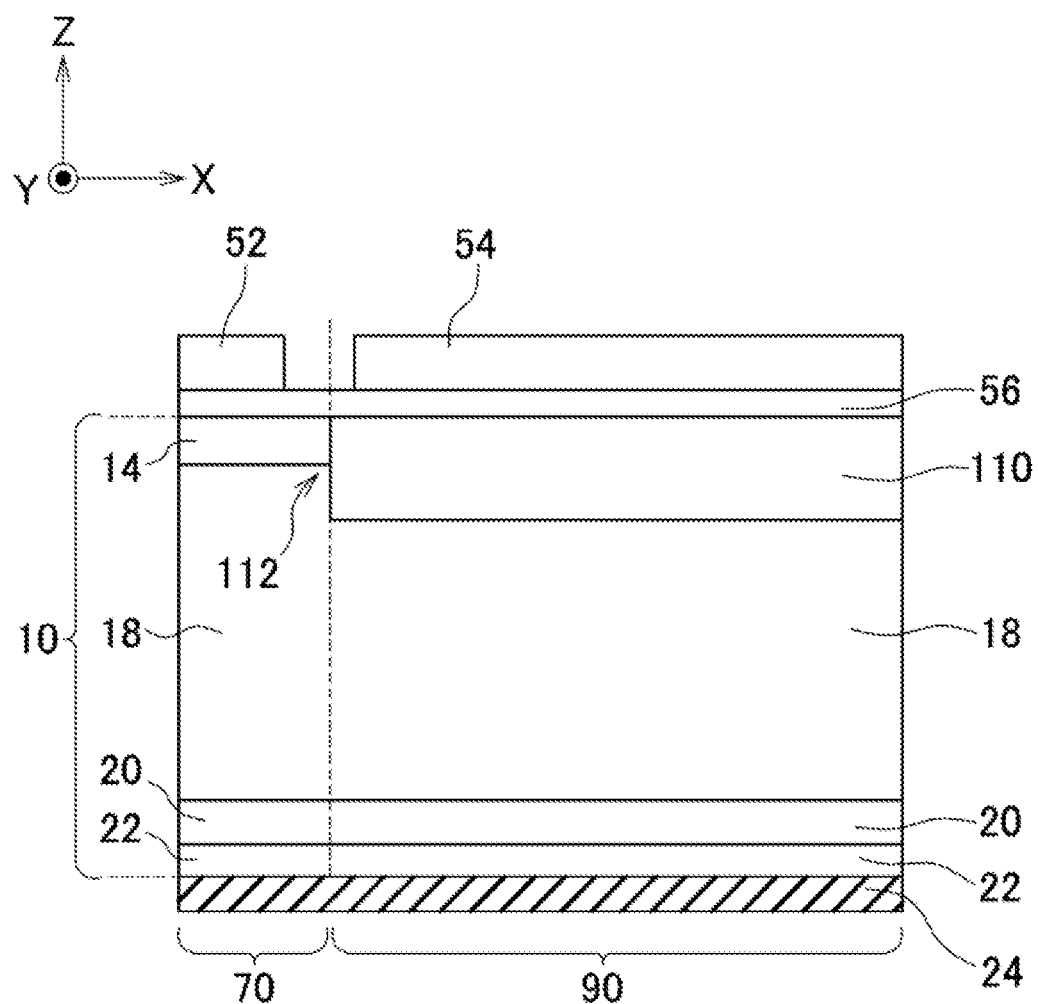
FIG. 5 is a view showing one example in cross section of a semiconductor device 300 in a comparative example.

An effect of the semiconductor device 100 of the present example constructed as described above will be described. A comparative example is referenced to describe the effect of the semiconductor device 100 in the present example. FIG. 5 is a view showing one example in cross section of a semiconductor device 300 in the comparative example. In the semiconductor device 300, the P type collector region 22 extends to occupy the region positioned below the P+ well region 110.

Figure 6:
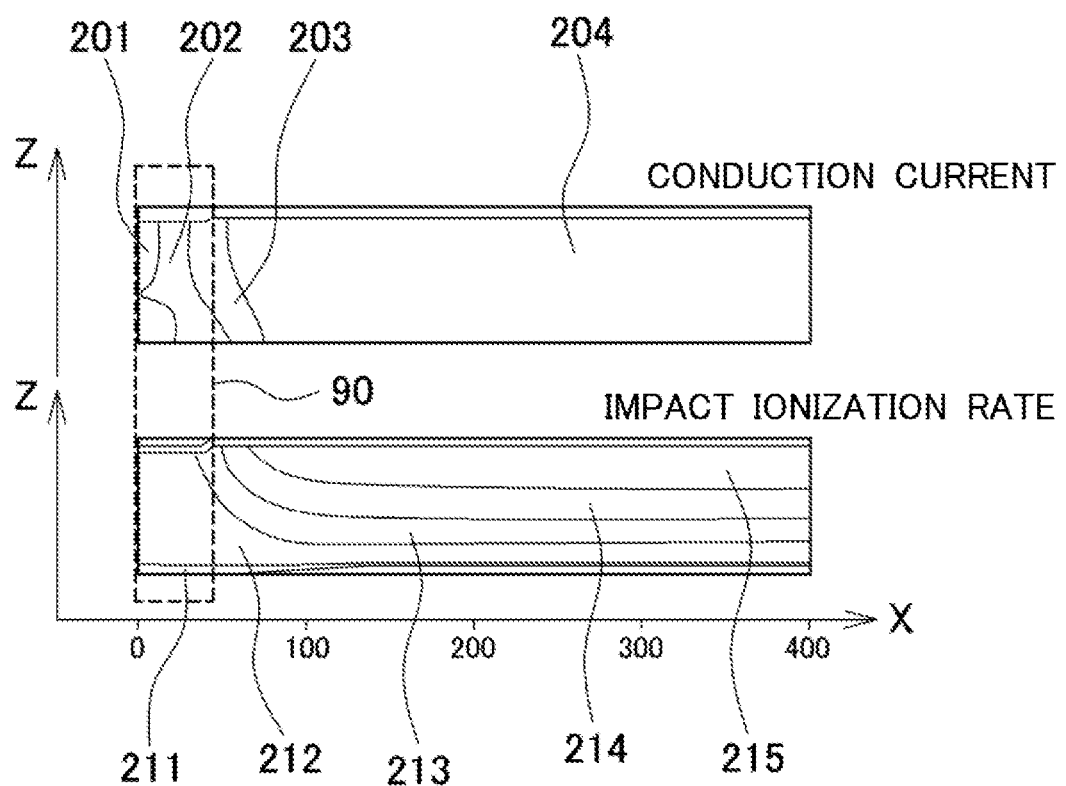
FIG. 6 is a view showing a simulation result with respect to a distribution of conduction currents and a distribution of impact ionization rates in the semiconductor device 100 in accordance with the embodiment of the present invention.
Figure 7:
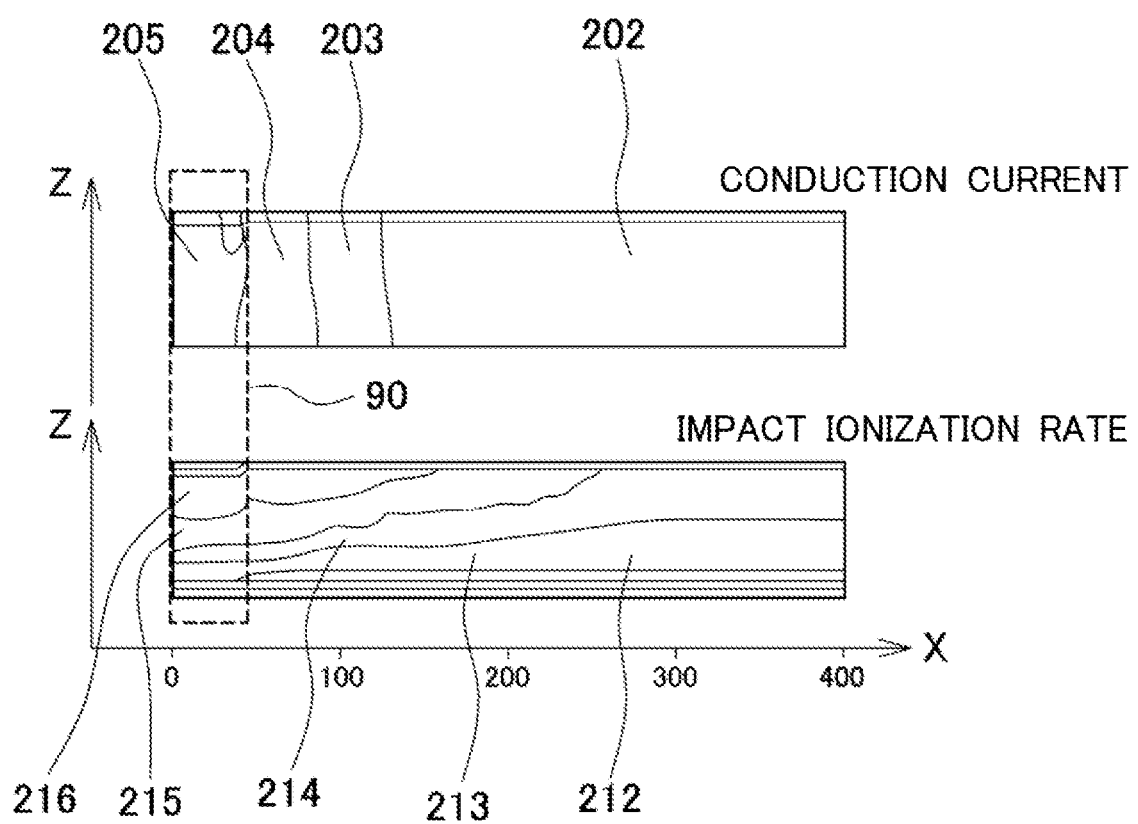
FIG. 7 is a view showing a simulation result with respect to a distribution of conduction currents and a distribution of impact ionization rates in the semiconductor device 300 of the comparative example.

FIG. 6 is a view showing a simulation result with respect to a distribution of conduction currents and a distribution of impact ionization rates in the semiconductor device 100 in accordance with the embodiment of the present invention. The upper stage of FIG. 6 shows the distribution of conduction currents in a voltage-clamped state. The lower stage of FIG. 6 shows the distribution of impact ionization rates in the voltage-clamped state. Similarly, FIG. 7 is a view showing a simulation result with respect to a distribution of conduction currents and a distribution of impact ionization rates in the semiconductor device 300 of the comparative example. In FIG. 6 and FIG. 7, the vertical axis indicates a depth direction (Z-axis direction), and the horizontal axis indicates an in-plane direction (X direction) in the front surface of the semiconductor substrate 10.

An area 201 shows an area of the smallest conduction current, and the conduction current becomes larger in an order of the area 201, an area 202, an area 203, an area 204, and an area 205. The area 205 shows the largest conduction current. As shown in FIG. 7, in the semiconductor device 300 of the comparative example, the conduction current in the signal pad region 90 where the P+ well region 110 exists shows the area 205 of the largest value. On the other hand, as shown in FIG. 6, in the semiconductor device 100 of the present example, the conduction current in the signal pad region 90 where the P+ well region 110 exists shows the area 201 and the area 202.

With respect to the impact ionization rate serving as an indication of the breakdown such as avalanche phenomenon, an area 211 shows the lowest area, and the impact ionization rates become larger in an order of the area 211, an area 212, an area 213, an area 214, an area 215 and an area 216. The area 216 shows the highest impact ionization rate. As shown in FIG. 7, in the semiconductor device 300 of the comparative example, the impact ionization rate in the signal pad region 90 where the P+ well region 110 exists shows the area 216 of the highest value. On the other hand, as shown in FIG. 6, in the semiconductor device 100 of the present example, the impact ionization rate in the signal pad region 90 where the P+ well region 110 exists shows the area 211 and the area 212.

In the semiconductor device 300 of the comparative example as shown in FIG. 7, in the signal pad region 90 where the P+ well region 110 exists, the impact ionization rate indicates a higher value, which shows an occurrence of the avalanche phenomenon. As a result, in the semiconductor device 300 of the comparative example, the current crowds in a region where the P+ well region 110 exists. On the other hand, in the semiconductor device 100 of the present embodiment as shown in FIG. 6, the avalanche phenomenon is prevented, which can prevent the current crowding in the region where the P+ well region 110 exists.

Figure 8:
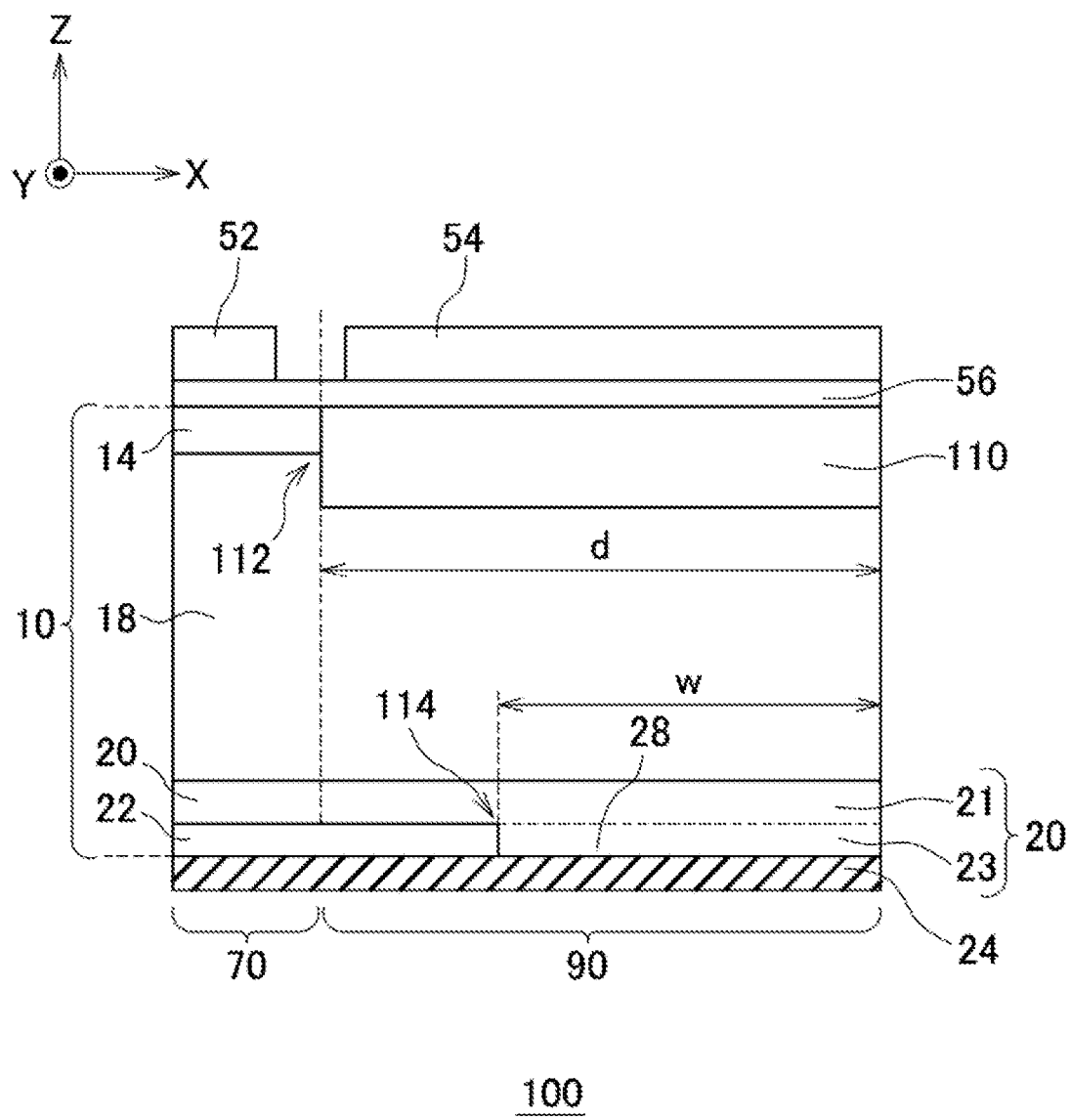
FIG. 8 is a view showing a positional relationship between a P+ well region 110 and a collector region 22.

FIG. 8 is a view showing a positional relationship between the P+ well region 110 and the collector region 22. In the present example, there is shown, as one example, a case where the P+ well region 110 is formed by an ion implantation using a mask of 36.5 μm in width, and an annealing treatment after the ion implantation. A width d of the P+ well region 110 is set to a predetermined value including a diffused portion by the annealing treatment. In the present example, the width d of the P+ well region 110 is 43 μm. The width w of the injection amount restricting portion 28 corresponds to a width of a portion in which the collector region 22 is not present.

In the case where the width w of the injection amount restricting portion 28 is smaller than the width d of the P+ well region 110, the collector region 22 extends to occupy the region positioned below the P+ well region 110. Accordingly, in the view from above, the collector region 22 overlaps with the P+ well region 110. Then, as the width w of the injection amount restricting portion 28 increases toward the width d of the P+ well region 110, an overlapping portion between the collector region 22 and the P+ well region 110 become smaller in the view from above. In the case where the width w of the injection amount restricting portion 28 is equal to or greater than the width d of the P+ well region 110, no collector region 22 is provided at all in the region positioned below the P+ well region 110. In other words, the injection amount restricting portion 28 occupies the entire region that is positioned below the P+ well region 110. In this case, in the view from above, the collector region 22 does not overlap the P+ well region 110.

Figure 9:
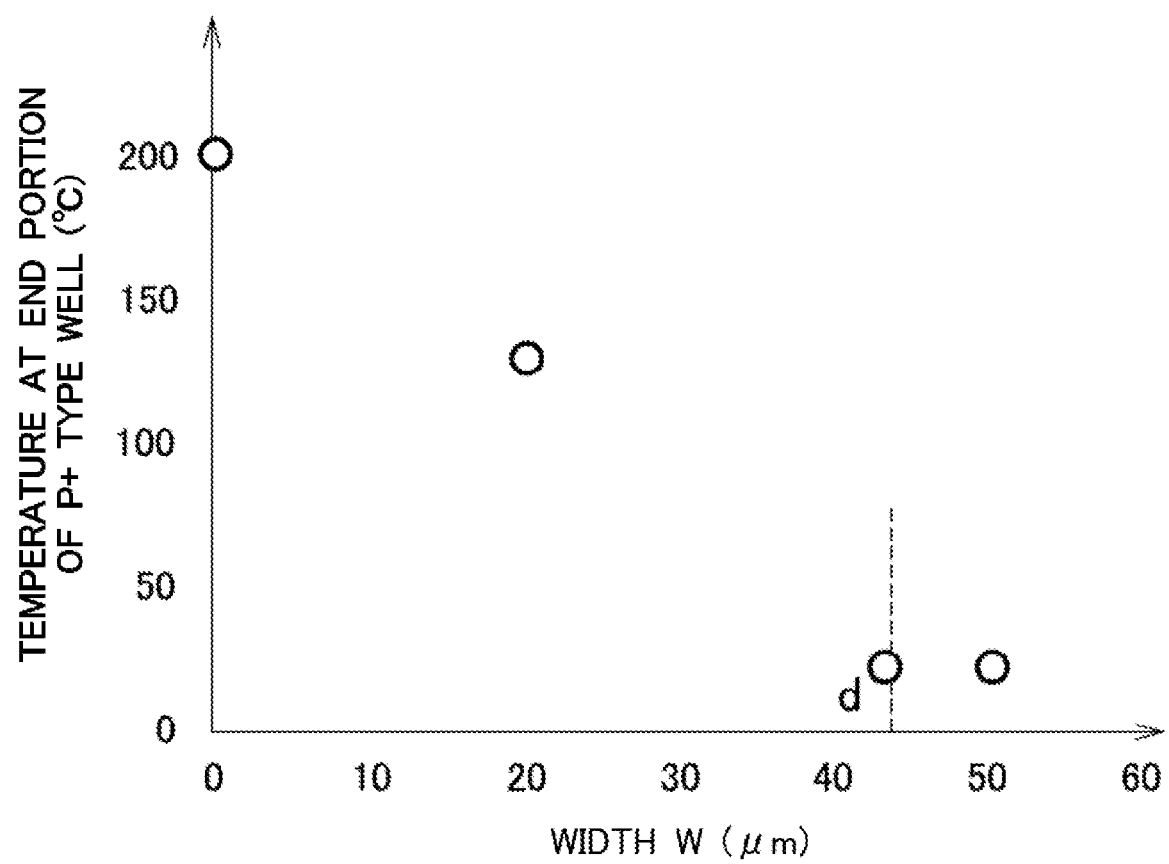
FIG. 9 is a view showing one example of a relationship between a width w of an injection amount restricting portion 28 and a temperature at an end portion 112 of the P+ well region 110.

FIG. 9 is a view showing one example of a relationship between the width w of the injection amount restricting portion 28 and a temperature at the end portion 112 of the P+ well region 110. In the case where the width w of the injection amount restricting portion 28 is zero, that is, in the case where the P type collector region 22 occupies the entire region positioned below the P+ well region 110, the temperature at the end portion 112 of the P+ well region 110 rises to about 200° C.°. This corresponds to the semiconductor device 300 of the comparative example shown in FIG. 5. Because the current crowds in the region where the P+ well region 110 exists, the rise in temperature is caused.

As the width w of the injection amount restricting portion 28 increases toward the width d of the P+ well region 110, the temperature at the end portion 112 of the P+ well region 110 is reduced. That is, as the overlapping portion between the collector region 22 and the P+ well region 110 become smaller in the view from above, the temperature at the end portion 112 of the P+ well region 110 is reduced. Then, when the width w of the injection amount restricting portion 28 reaches the width d of the P+ well region 110, there is no overlap between the collector region 22 and the P+ well region 110 in the view from above, and the temperature at the end portion 112 of the P+ well region 110 indicates the minimum value.

According to the present example, in the case where the width w of the injection amount restricting portion 28 is 60% of the width d of the P+ well region 110, that is, in the case where the region occupied by the injection amount restricting portion 28 is equivalent to 60% of the region positioned below the P+ well region 110, the temperature at the end portion 112 of the P+ well region 110 can be regulated to be equal to or lower than 100° C.°. In the case where the width w of the injection amount restricting portion 28 is 90% of the width d of the P+ well region 110, that is, in the case where the region occupied by the injection amount restricting portion 28 is equivalent to 90% of the region positioned below the P+ well region 110, the temperature at the end portion 112 of the P+ well region 110 can be regulated to be equal to or lower than 50° C.°. Further, in the case where the width w of the injection amount restricting portion 28 is equal to or greater than the width d of the P+ well region 110, that is, in the case where the injection amount restricting portion 28 occupies the entire region positioned below the P+ well region 110, the temperature at the end portion 112 of the P+ well region 110 can be regulated to be equal to approximately room temperature. Accordingly, the region occupied by the injection amount restricting portion 28 is preferably equivalent to 60% or greater of the projected region, which is obtained by projecting the P+ well region 110 onto the back surface of the semiconductor substrate 10, more preferably to 90% or greater of the projected region, and further preferably to the entire projected region.

According to the semiconductor device 100 of the present example, heat generation due to the current crowding is reduced so that damage to the signal pad region 90 to be caused by the heat generation can be prevented from occurring. In particular, damage to the insulating film 56 to be caused by the heat generation due to the current crowding can be prevented from occurring. As a result, the withstand capability can be improved. In addition, because it is configured that the collector region 22 is not provided only in the signal pad region 90, an IGBT characteristic in the transistor portion 70 is less effected.

Figure 10:
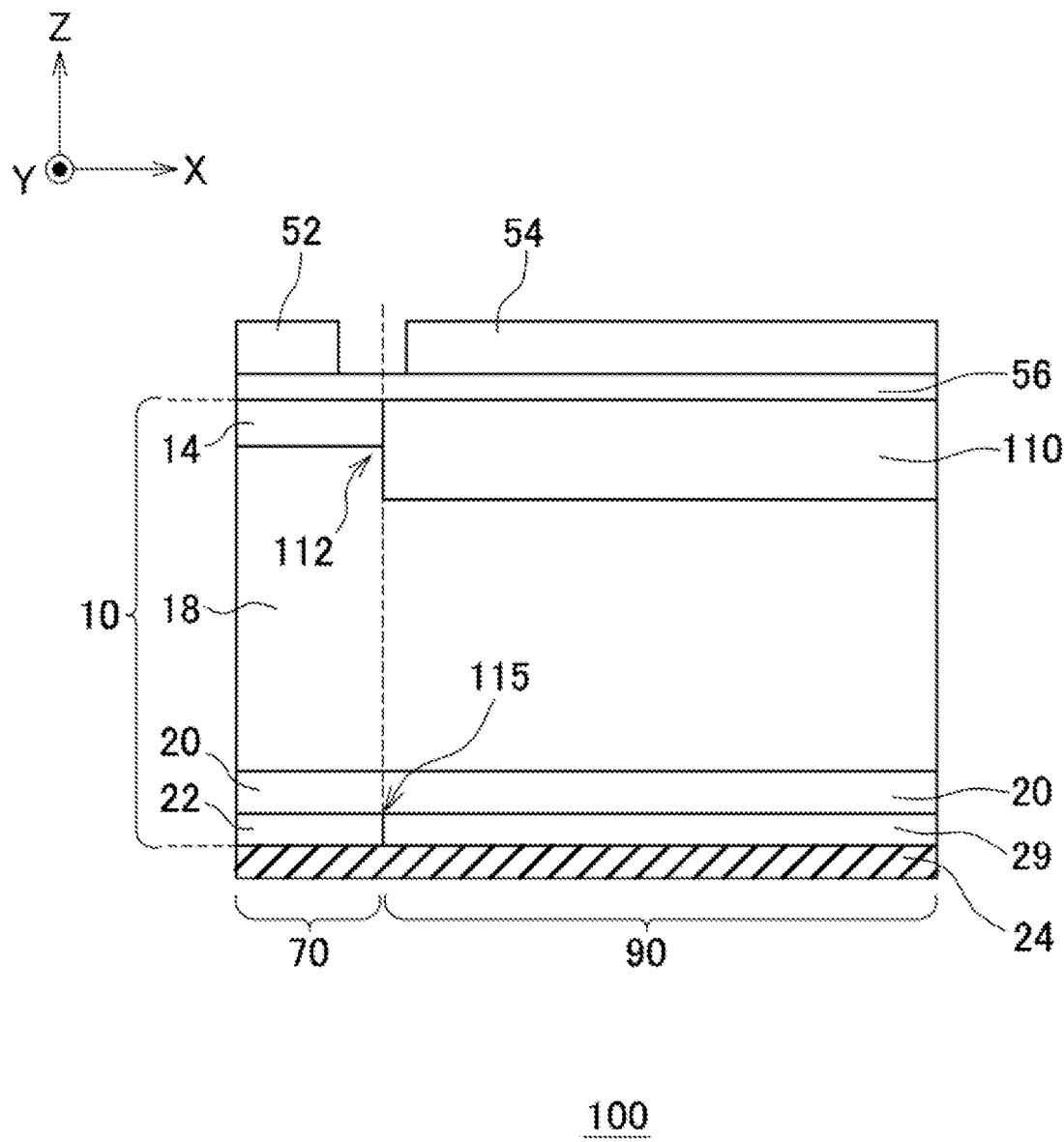
FIG. 10 is a view showing one example of a C-C' section in the semiconductor device 100 in accordance with a second embodiment of the present invention.

FIG. 10 is a view showing one example of a C-C' section in the semiconductor device 100 in accordance with a second embodiment of the present invention. In the semiconductor device 100 of the first embodiment, there is described a case that includes the conductive layer of the first conductivity type that is provided below the P+ well region 110 at the same depth as the collector region 22. On the other hand, in the present example, an injection amount restricting portion comprises a conductive layer 29 of the second conductivity type provided below the P+ well region 110. The conductive layer 29 of the second conductivity type has a doping concentration of the second conductivity type that is lower than a doping concentration of the second conductivity type in the collector region 22. The conductive layer 29 is of P type.

In the present example, the conductive layer 29 of the second conductivity type that acts as the injection amount restricting portion occupies the entire region that is positioned below the P+ well region 110. In a view from above, the conductive layer 29 of the second conductivity type may be partitioned to include at least the P+ well region 110. In the view from above, a position of an end portion of the conductive layer 29 may match with the position of the end portion 112 of the P+ well region 110. In the present example, the conductive layer 29 is provided at the same depth as that of the collector region 22. The conductive layer 29 may be in contact with a back surface electrode 24. Apart from the structure of the injection amount restricting portion, the structure of the semiconductor device 100 of the present example is the same as that of the semiconductor device 100 in the first embodiment. Accordingly, a repeated description will be omitted.

The semiconductor device 100 of the present example can be manufactured by a variety of manufacturing methods. For example, when the back surface structure of the semiconductor device 100 is formed, the P type impurities are implanted such that the collector region 22 and a corresponding region (i.e., signal pad region 90) under the P+ well region 110 have a first doping concentration in common. Then, after a mask that covers the region corresponding to the region positioned below the P+ well region 110, that is, a mask that covers the signal pad region 90 is formed, a P type impurity may be implanted additionally in the collector region 22 to have a second doping concentration higher than the first doping concentration. The semiconductor device 100 of the second embodiment can be manufactured by the above manufacturing method.

In the semiconductor device 100 in the present example, the conductive layer 29 has the doping concentration of the P type impurity of the second conductivity type that is lower than that of the collector region 22.

Due to a difference in doping concentration of the P type impurity, the conductive layer 29 has a carrier injection amount of the second conductivity type per unit area that is smaller than that of the collector region 22. Accordingly, the conductive layer 29 acts as the injection amount restricting portion. Also by the present example, the carrier injection amount of the second conductivity type is reduced into the part in which the P+ well region 110 is provided, so that the breakdown voltage can be increased.

Figure 11:
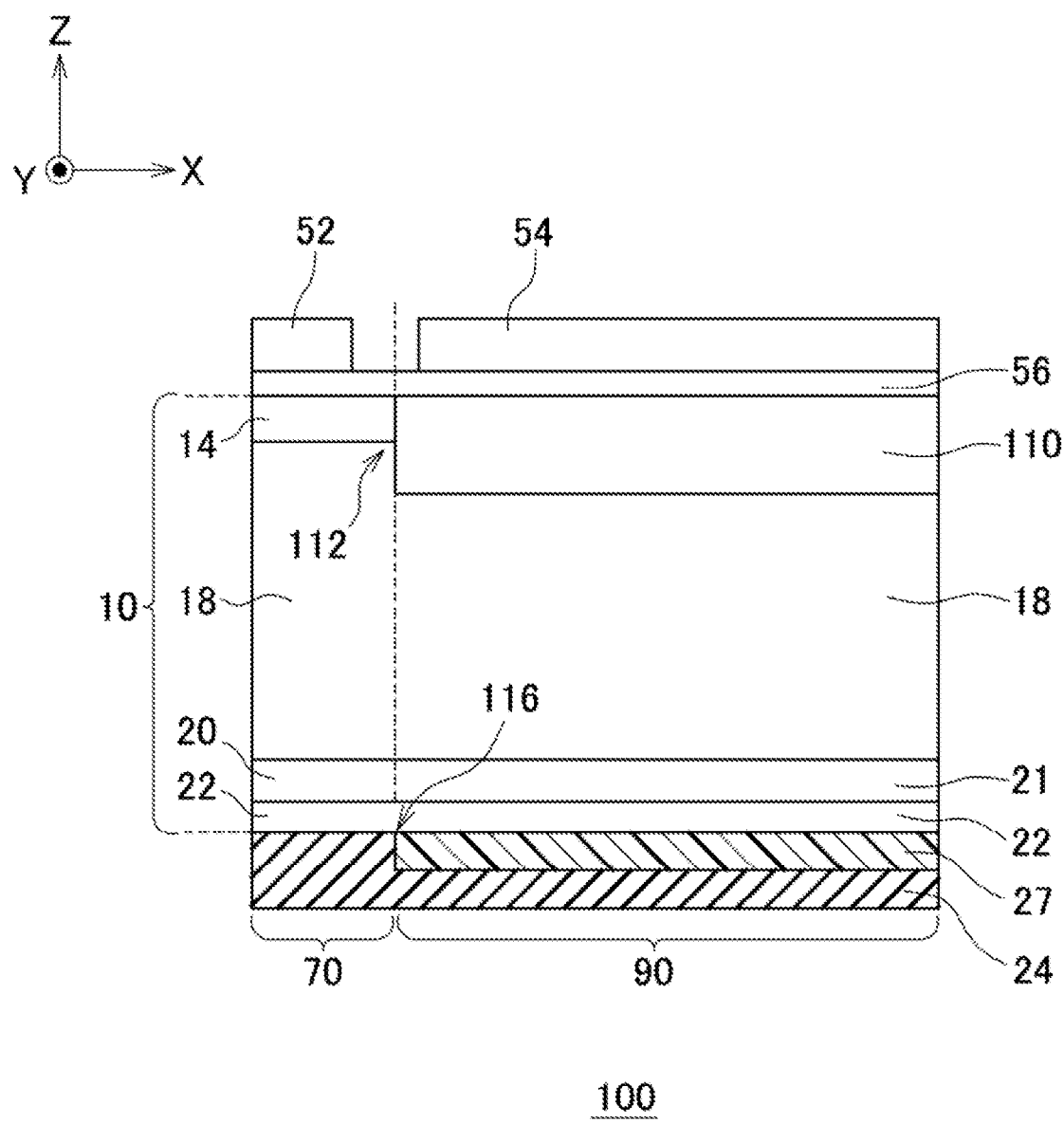
FIG. 11 is a view showing one example of a C-C' section in the semiconductor device 100 in accordance with a third embodiment of the present invention.

FIG. 11 is a view showing one example of a C-C' section in the semiconductor device 100 in accordance with a third embodiment of the present invention. In the present example, the injection amount restricting portion includes an insulating film 27 provided below the P+ well region 110 and between the semiconductor substrate 10 and the back surface electrode 24. As one example, the insulating film 27 is formed of an oxide film such as silicon oxide film or a nitride film such as silicon nitride film.

In the present example, the insulating film 27 that acts as the injection amount restricting portion occupies the entire region positioned below the P+ well region 110. In a view from above, the insulating film 27 may be partitioned to include at least the P+ well region 110. In the view from above, a position of an end portion 116 of the insulating film 27 may match with the position of the end portion 112 of the P+ well region 110. In the present example, the P type collector region 22 may extend to occupy the region positioned below the P+ well region 110. the insulating film 27 may be provided to be in contact with the collector region 22. Apart from the structure of the injection amount restricting portion, the structure of the semiconductor device 100 of the present example is the same as that of the semiconductor device 100 in the first and second embodiments. Accordingly, a repeated description will be omitted.

The semiconductor device 100 of the present example can be manufactured by a variety of manufacturing methods. For example, after the collector region 22 is formed on the back surface of the semiconductor device 100, an insulating film is formed in the collector region 22. The insulating film 27 is left in the signal pad region 90 by patterning of the insulating film. Thereby, the collector region 22 is exposed in the transistor portion 70. The back surface electrode 24 is formed to cover the exposed collector region 22 and the insulating film 27. The back surface electrode 24 may be flattened as needed. There is no electrical conduction between the insulating film 27 and the back surface electrode 24. Accordingly, in a region where the insulating film 27 is provided, it may be intended that the back surface electrode 24 is not provided.

According to the semiconductor device 100 of the present example, the carrier injection amount of the second conductivity type into the portion in which the P+ well region 110 is provided is restricted by the insulating film 27. Accordingly, also by the present example, the breakdown voltage can be increased.

Figure 12:
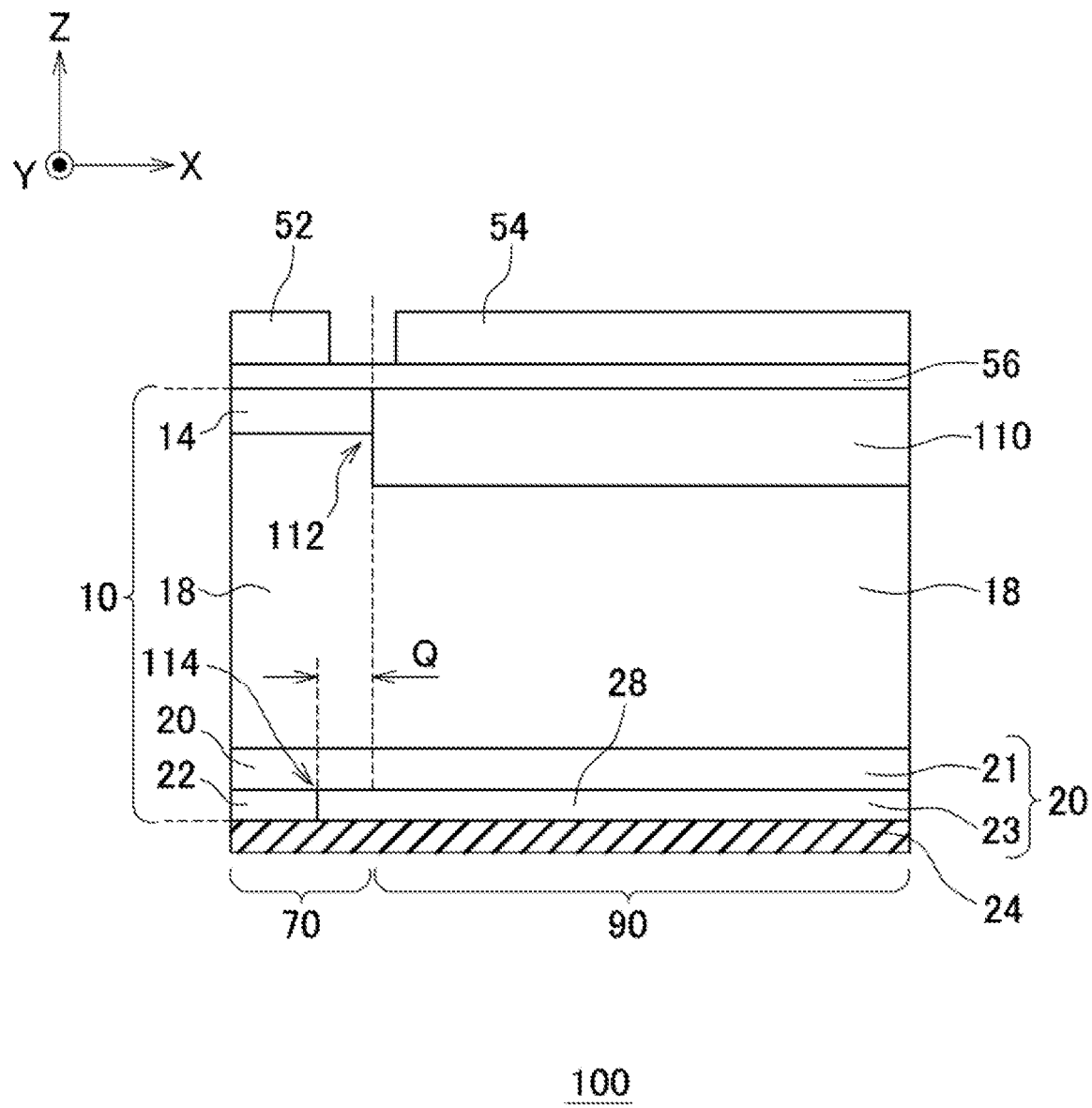
FIG. 12 is a view showing one example of a C-C' section in the semiconductor device 100 in accordance with a fourth embodiment of the present invention.

FIG. 12 is a view showing one example of a C-C' section in the semiconductor device 100 in accordance with a fourth embodiment of the present invention. In the present example, the injection amount restricting portion 28 includes an N type conductive layer that is provided below the P+ well region 110 at the same depth as the collector region 22. In the present example, the buffer region 20 is provided as the N type conductive layer. In the present example, the region in which the injection amount restricting portion 28 is provided is wider than a projected region where the P+ well region 110 is projected on the back surface of the semiconductor substrate 10. As a result, the end portion 114 of the injection amount restricting portion 28 is located closer to the transistor portion 70 side than the end portion 112 of the P+ well region 110. Accordingly, the transistor portion 70 has a portion in which no collector region 22 is provided. The end portion 114 of the injection amount restricting portion 28 (the end portion of the collector region 22) is spaced away by a distance Q from the end portion 112 of the P+ well region 110 in the view from above. The distance Q may be between 0 µm and 50 µm. When the distance Q is 50 µm or longer, there is a case where the characteristic of the transistor portion 70 is effected. Thus, it is desirable that the distance Q be 50 µm or shorter.

While the embodiments of the present invention have been described, the technical scope of the invention is not limited to the above described embodiments. The embodiments may be combined. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising a transistor portion and a diode portion,
    the transistor portion having: a first-conductivity-type drift region formed inside a semiconductor substrate; a second-conductivity-type base region provided above the drift region inside the semiconductor substrate; and
    a second-conductivity-type collector region provided below the drift region inside the semiconductor substrate, and
    the transistor portion having a second-conductivity-type well region provided inside the semiconductor substrate and extending downward beyond the base region, and
    the transistor portion having an injection amount restricting portion occupying at least a part of a region that is positioned below the well region, the injection amount restricting portion having a smaller second-conductivity-type carrier injection amount per unit area than the collector region,
    wherein the well region has a higher second-conductivity-type doping concentration than the base region.

2. The semiconductor device according to claim 1, wherein
    the transistor portion includes an insulated gate bipolar transistor, and
    the diode portion includes a freewheeling diode that is electrically connected to the insulated gate bipolar transistor.

3. The semiconductor device according to claim 1, comprising a signal pad region in direct contact with the transistor portion or the diode portion,
    wherein the signal pad region comprises:
    an insulating film formed on a front surface of the semiconductor substrate; and
    a conductive portion formed on the insulating film, wherein
    the well region is provided below the conductive portion.

4. The semiconductor device according to claim 1, wherein the injection amount restricting portion includes a first-conductivity-type conductive layer that is provided below the well region at a same depth as the collector region.

5. The semiconductor device according to claim 4, wherein the first-conductivity-type conductive layer has a higher first-conductivity-type conductive layer has a higher first-conductivity-type doping concentration than the drift region.

6. The semiconductor device according to claim 1, wherein the injection amount restricting portion includes a second-conductivity-type conductive layer that is provided below the well region, and
    the second-conductivity-type conductive layer has a lower second-conductivity-type doping concentration than the collector region.

7. The semiconductor device according to claim 1, wherein the transistor portion further has a back surface electrode that is provided on a back surface of the semiconductor substrate and that is electrically connected to the collector region, and
    the injection amount restricting portion includes an insulating film that is provided between the semiconductor substrate and the back surface electrode.

8. The semiconductor device according to claim 1, wherein the injection amount restricting portion occupies an entire region that is positioned below the well region.

9. A semiconductor device comprising a transistor portion and a diode portion,
    the transistor portion having: a first-conductivity-type drift region formed inside a semiconductor substrate; a second-conductivity-type base region provided above the drift region inside the semiconductor substrate; and a second-conductivity-type collector region provided below the drift region inside the semiconductor substrate, the transistor portion having a second-conductivity-type well region provided inside the semiconductor substrate and extending downward beyond the base region, the transistor portion having an injection amount restricting portion occupying at least a part of a region that is positioned below the well region, the injection amount restricting portion having a smaller second-conductivity-type carrier injection amount per unit area than the collector region, and a signal pad region in direct contact with the transistor portion or the diode portion, wherein the signal pad region comprises:
   an insulating film formed on a front surface of the semiconductor substrate; and
   a conductive portion formed on the insulating film, wherein the well region is provided below the conductive portion, and the injection amount restricting portion is provided below a boundary point at which the transistor portion, the diode portion and the signal pad region abut one another.

* * * * *